United States Patent
Walker et al.

(10) Patent No.: US 10,062,444 B2
(45) Date of Patent: *Aug. 28, 2018

(54) DEVICES, SYSTEM, AND METHODS FOR IMPLEMENTING ALTERNATE CONTROL SETTINGS

(71) Applicant: Intel Corporation, Santa Clara, CA (US)

(72) Inventors: Julie M. Walker, El Dorado Hills, CA (US); Doyle Rivers, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/018,109

(22) Filed: Feb. 8, 2016

(65) Prior Publication Data
US 2016/0260499 A1    Sep. 8, 2016

Related U.S. Application Data

(63) Continuation of application No. 13/525,567, filed on Jun. 18, 2012, now Pat. No. 9,257,162.

(51) Int. Cl.
*G11C 17/00* (2006.01)
*G11C 17/18* (2006.01)
*G11C 7/20* (2006.01)
*G11C 16/20* (2006.01)
*G11C 17/16* (2006.01)

(52) U.S. Cl.
CPC ............ *G11C 17/18* (2013.01); *G11C 7/20* (2013.01); *G11C 16/20* (2013.01); *G11C 17/165* (2013.01)

(58) Field of Classification Search
CPC ........ G11C 17/18; G11C 17/165; G11C 16/20; G11C 7/20
USPC ................. 365/94, 189.05, 189.07, 225.7, 96
See application file for complete search history.

(56) References Cited

U.S. PATENT DOCUMENTS

| 7,688,663 | B2 | 3/2010 | Chu et al. |
| 2006/0253644 | A1 | 11/2006 | Stefano et al. |
| 2008/0025067 | A1 | 1/2008 | Scheuerlein et al. |
| 2008/0151593 | A1* | 6/2008 | Chen ................... G11C 29/816 365/96 |
| 2009/0231912 | A1 | 9/2009 | Liu |
| 2010/0277990 | A1 | 11/2010 | Kenkare et al. |
| 2011/0176380 | A1* | 7/2011 | Bentley ................. G11C 16/22 365/225.7 |

(Continued)

OTHER PUBLICATIONS

International Search Report and Written Opinion for PCT Patent Application No. PCT/US2013/044077 dated Sep. 4, 2013, 11 Pages.

*Primary Examiner* — Tha-O H Bui
(74) *Attorney, Agent, or Firm* — Thorpe, North & Western, LLP

(57) ABSTRACT

An integrated circuit, that may be a part of an electronic system, may include a first set of storage cells to store settings and a second set of storage cells to store alternate settings. At least one control cell may also be included in the integrated circuit. The at least one control cell may indicate whether to use the settings stored in the first set of storage cells, or the alternate settings stored in the second set of storage cells, to control one or more operating parameters of the integrated circuit. Methods for using the alternate setting are also described.

20 Claims, 6 Drawing Sheets

(56) References Cited

U.S. PATENT DOCUMENTS

2012/0008399 A1  1/2012  Hoei et al.
2012/0120733 A1* 5/2012  Son .................. G11C 17/14
                                            365/189.02

* cited by examiner

DEVICES, SYSTEM, AND METHODS FOR IMPLEMENTING ALTERNATE CONTROL SETTINGS

PRIORITY DATA

This application is a continuation of U.S. patent application Ser. No. 13/525,567, filed Jun. 18, 2012, now issued as U.S. Pat. No. 9,257,162, which is incorporated herein by reference in its entirety.

BACKGROUND

Technical Field

The present subject matter relates to integrated circuits, and more particularly, to initializing an integrated circuit.

Background Art

Many integrated circuits (ICs) include adjustable parameters in their design that may be configured after a testing process to determine the proper setting for those parameters. To adjust the parameters, a configuration register in the IC may be loaded with a value that changes the parameter to the desired value. Many types of parameters may be adjusted, including timing parameters and electrical parameters, as well as enabling/disabling various functional blocks in the IC.

Some ICs use programmable memory cells to hold the desired values to load into the configuration registers. The programmable memory cells may be one-time programmable cells such as fuses or anti-fuses. In such cases, once a value has been programmed into the memory cells, it may not be modified further. So if it is later determined that the value programmed into the memory cells is incorrect or non-optimal, the IC may need to be scrapped, as the parameters may not be changeable to the newly desired value.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

Figure 1:
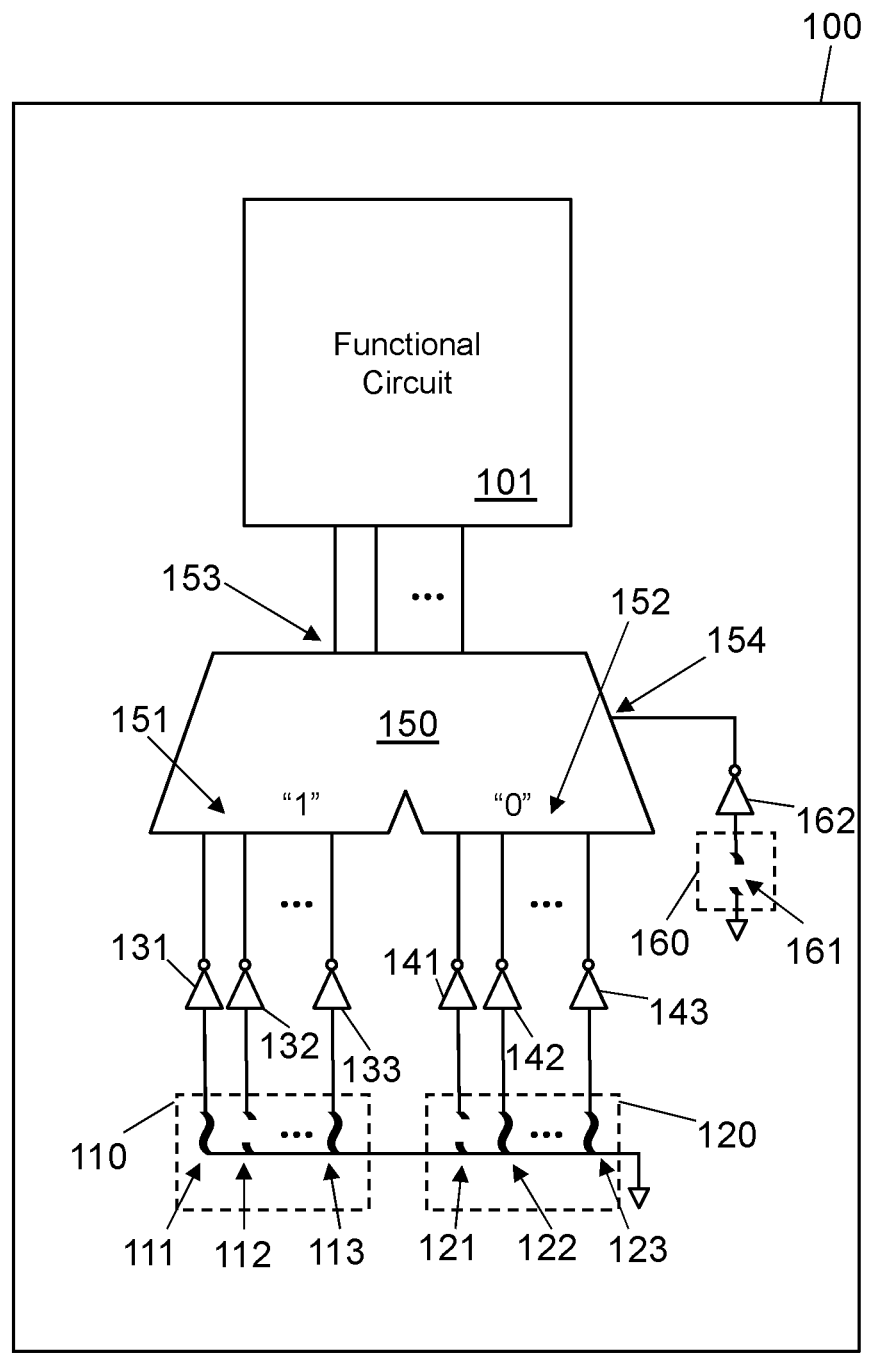
FIG. 1 is a block diagram of an integrated circuit with an embodiment of alternate control settings.

FIG. 1 is a block diagram of an integrated circuit (IC) 100 with an embodiment of alternate control settings. The IC includes a functional circuit 101 that implements the function desired of the IC such as a processor, a memory array, an input/output (I/O) controller, or any other function that may be implemented in an IC 100. The IC 100 may have parameters that may be changed to meet specifications of the IC 100. The parameters may be changed for many different reasons, including, but not limited to, compensation for variations in the IC 100 due to manufacturing processes, to mask a failure or degradation of a particular circuit in the IC, or to meet a changed specification, among other reasons. Examples of parameters that may be changed include timing parameters, electrical parameters, changes to a function of the IC 100, enabling/disabling functional blocks within the functional circuit 101, or any other parameter of the IC 100. Examples of timing parameters that may be changed include as set-up times and/or hold times for inputs and/or outputs, delays to account for circuit speed such as a number of clock times for a pipeline stage to complete or a memory access, or any other timing parameter that may be controlled or varied. Examples of electrical parameters that may be changed include drive current and/or output voltage levels of an output driver, voltage thresholds of an input, voltage levels of internal power supplies, or any other electrical parameter that may be controlled or varied. An example of functional changes is changing an algorithm of a functional block, and an example of enabling/disabling a functional block is to disable a functional block if it is determined to be defective during test.

The IC 100 may include a first set of storage cells 110 to store settings and a second set of storage cells 120 to store alternate settings. At least one control cell 160 may also be included. The storage cells 110, 120 and the at least one control cell 160 may be any type of storage, but non-volatile cells that retain their contents if power is removed may be used in many embodiments. Some embodiments may utilize one-time programmable cells for the storage cells 110, 120 and/or the at least one control cell 160, and some embodiments may use fuse links or anti-fuse links for the storage cells 110, 120 and/or the at least one control cell 160.

The first set of storage cells 110 may include any number of cells but in the embodiment shown, three fuse links are included to provide three storage cells. In the example shown, a first fuse link 111 is intact, a second fuse link 112 is open, and a third fuse link 113 is intact. The three fuse links 111-113 may be programmed during a manufacturing test process to configure the IC 100. The three fuse links 111-113 may be coupled to a first set of inverters 131, 132, 133 having internal pull-ups in their inputs so that the inverters coupled to intact fuse links, such as inverter 131 and inverter 133, have their inputs pulled to ground causing the inverters 131, 133 to drive their outputs to a high level. Inverters coupled to open fuse links, such as inverter 132, have their inputs pulled up, so their outputs are low. The outputs of the first set of inverters 131-133 are coupled to the "1" inputs 151 of a multiplexer 150. The multiplexer 150 is controlled by a control input 154 that is driven by inverter 162. The input of the inverter 162 is coupled to the at least one control cell 160, or fuse link 161. Other embodiments may include multiplexers with multiple control inputs to select among multiple sets of inputs. Initially, the fuse link 161 may be left intact so that the "1" inputs 151 are fed to the output 153 of the multiplexer 150. The output 153 of the multiplexer 150 may be coupled to the functional circuit 101 to control one or more parameters of the integrated circuit 100.

At some point it may be determined to change one or more operating parameter of the IC 100. Because the first set of storage cells 110 are one-time programmable, it may not be possible to change the values stored in the first set of storage cells 110 to the desired value. Specifically for this example, if the second storage cell needs to be changed from a "0" to a "1", it may not be possible to change the second fuse link 112 back to an intact state. So to allow the change to be made, the second set of storage cells 120 may be programmed to the new desired value, and the at least one control cell 160 changed to indicated that the second set of storage cells 120 are to be used to control one or more parameters of the IC 100.

The second set of storage cells 120 may include any number of cells, but in the embodiment shown, the same number of fuse links are included in the second set of storage cells 120 as are included in the first set of storage cells 110. The first fuse link 121 is open and is coupled to inverter 141. The second fuse link 122 and third fuse link 123 are intact and are coupled to inverter 142 and inverter 143 respectively. The outputs of the inverters 141-143 are coupled to the "0" inputs 152 of the multiplexer 150. The fuse link 161 may then be programmed to open the fuse link 161 so that the multiplexer 150 feeds the "0" inputs 152 to the output 153. The output 153 is coupled to the functional circuit 101 and the values stored in the second set of storage cells 120 control one or more parameters of the integrated circuit 100. So a state of the at least one control cell 160 indicates whether to use the settings stored in the first set of storage cells 110, or the alternate settings stored in the second set of storage cells 120, to control one or more operating parameters of the integrated circuit 100. In the embodiment shown in FIG. 1, the outputs of a multiplexer 150, controlled by an output of at least one control cell 160, and having a first set of inputs 151 coupled to outputs of the first set of storage cells 110, and a second set of inputs 152 coupled to outputs of the second set of storage cells 152, control one or more operating parameters of the integrated circuit 100.

Figure 2:
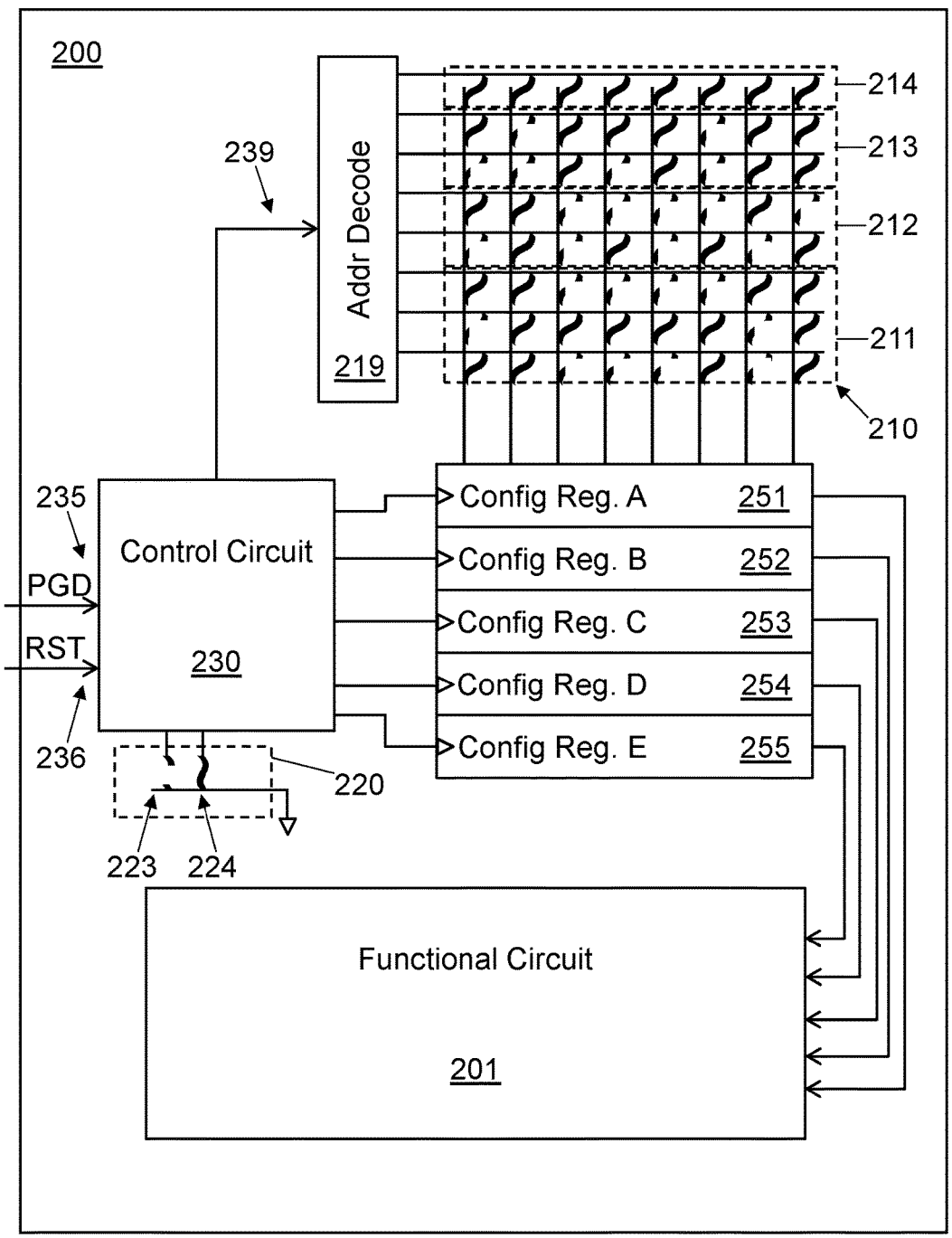
FIG. 2 is a block diagram of an integrated circuit with another embodiment of alternate control settings.

FIG. 2 is a block diagram of an integrated circuit (IC) 200 with another embodiment of alternate control settings. The IC 200 includes a functional circuit 201 that implements the function desired of the IC 200 such as a processor, a memory array, an input/output (I/O) controller, or any other function that may be implemented in an IC 200. The IC 200 may have parameters that may be changed to meet specifications of the IC 200, which may be similar to the parameters described for the IC 100 shown in FIG. 1.

The IC 200 may include an array of one-time programmable, non-volatile, memory cells 210, although other embodiments may utilize different non-volatile or volatile memory technologies for some or all of memory cells. Examples of non-volatile memory technologies that may be used include, but are not limited to, flash memory, mask programmable read only memory (ROM), optically erasable programmable read only memory (EPROM), nanowire based memory, ferro-electric transistor random access memory (FeTRAM), phase-change memory (PCM), and PCM with switch (PCMS). Examples of volatile memory technologies that may be used include various types of dynamic random access memory (DRAM), and static random access memory (SRAM). The array 210 shown includes 8×8 storage cells but other embodiments may have any size and organization of memory cells. The array 210 may include several different sets of storage cells such as a first set of storage cells 211, a second set of storage cells 212, a third set of storage cells 213 and a fourth set of storage cells 214. In the embodiment shown, the various sets of storage cells 211-214 include full rows of the array 210, but other embodiments may have any sized sets of storage cells that may not be full rows of the array 210.

A control circuit 230 may be coupled to at least one control cell 220, which in the embodiment shown includes a first fuse link 223 and a second fuse link 224. A power good input 235 and a reset input 236 may also be coupled to the control circuit 230. In some embodiments, the control circuit 230 may initialize the IC 200 in response to the inputs 235, 236, although other embodiments may initialize the IC 200 at different times, such as in response to another input, or in response to action of the functional circuit 201, such as executing a software command. In at least one embodiment, the control circuit 230 may initialize the IC 200 while the reset line 236 is asserted to the IC 200, and in some embodiments, the control circuit 230 may initialize the IC 200 in response to the application of power to the IC 200, which may be indicated in some embodiments by assertion of the power good input 235.

The control circuit 230 may generate an address 239 which is coupled to the address decoder 219. The address decoder 219 may then drive one row line, or word line, of the array 210 to a low state. The column lines, or bit lines, of the array 210 may be pulled up to a positive voltage so that an intact fuse link coupled to a word line that is pulled low will pull the coupled bit line low, and an open fuse link coupled to a word line that is pulled low will allow the coupled bit line to go high.

The embodiment shown in FIG. 2 has five configuration registers 251-255 whose outputs are coupled to the functional circuit 201 and may control one or more operating parameters of the IC 200. Other embodiments may have any number of configuration registers. The control circuit 230 is coupled to the five configuration registers 251-255 to selectively latch data from the array 210 into the configuration registers 251-255. The control circuit 230 may load configuration register A 251 by setting the address 239 to "0" and then latching the data from the zeroth row, which is a part of the first set of storage cells 211, into configuration register A 251 after an appropriate length of time to allow the address 239 to propagate through the address decoder 219, and to allow the data from the array 210 to propagate to the configuration register A 251. The control circuit 230 may load configuration register B 252, and configuration register C 253 with data from first and second row of the array 210, which are also a part of the first set of storage cells 211. Configuration register D 254, and configuration register E 255 may be loaded with data from the second set of storage cells 212 by the control circuit 230 using similar techniques. The third set of storage cells 213 may be used to store alternative data to load into configuration register D 254 and configuration register E 255, and the fourth set of storage cells 214 may be used to store alternative data to load into configuration register D 254. Various embodiments may have any number of sets of storage cells to hold alternative data for different configuration registers. In some embodiments, the association of a particular set of storage cells with a particular set of configuration registers is determined at design time, although some embodiments may include mechanisms that may be used to associate a particular set of storage cells with a particular set of configuration registers after the IC 200 has been fabricated.

The control circuit 230 may then examine the control cells 220 to determine if the alternative data in the third set of storage cells 213 and/or fourth set of storage cells 214 should be used to overwrite some of the configuration registers 251-255. In the embodiment shown, fuse link 223 is open to indicate that the data from the third set of storage cells 213 should be loaded into configuration register D 254 and configuration register E 255, so the control circuit 230 may load the data from the third set of storage cells 214 into configuration register D 254 and configuration register E 255. If the fuse link 223 was intact, the data from the second set of storage cells 212 would be left in configuration register D 254 and configuration register E 255. Fuse link 224 is intact, so the data in the fourth set of configuration registers 214 is not used. Some embodiments may examine the control cells 220 before any data that may be replaced is loaded into a configuration register 251-255. In such embodiments, only the final data is loaded, so in the example shown, the data from the second set of configuration registers 212 would not loaded into configuration register D 254 and configuration register E 255; only the data from the third set of storage cells 213 would be loaded into configuration register D 254 and configuration register E 255.

If at some later time, it is determined that operating parameter controlled by configuration register D 254 should be changed, the appropriate data may be programmed into the fourth set of storage cells 214 and fuse link 224 opened. If the control circuit 230 detects that fuse link 224 is open during an initialization phase, it may then load the data from the fourth set of storage cells 214 into configuration register D 254. So the control circuit 230 may access the array 210 based on a value of the at least one control cell 220 and to write values, based on information accessed from the array 210, into one or more registers 251-255, to control the one or more operating parameters of the integrated circuit 200. Thus a state of the at least one control cell 220 determines a state of the address lines 239 coupled to the array to control which memory cells of the array are accessed.

Figure 3:
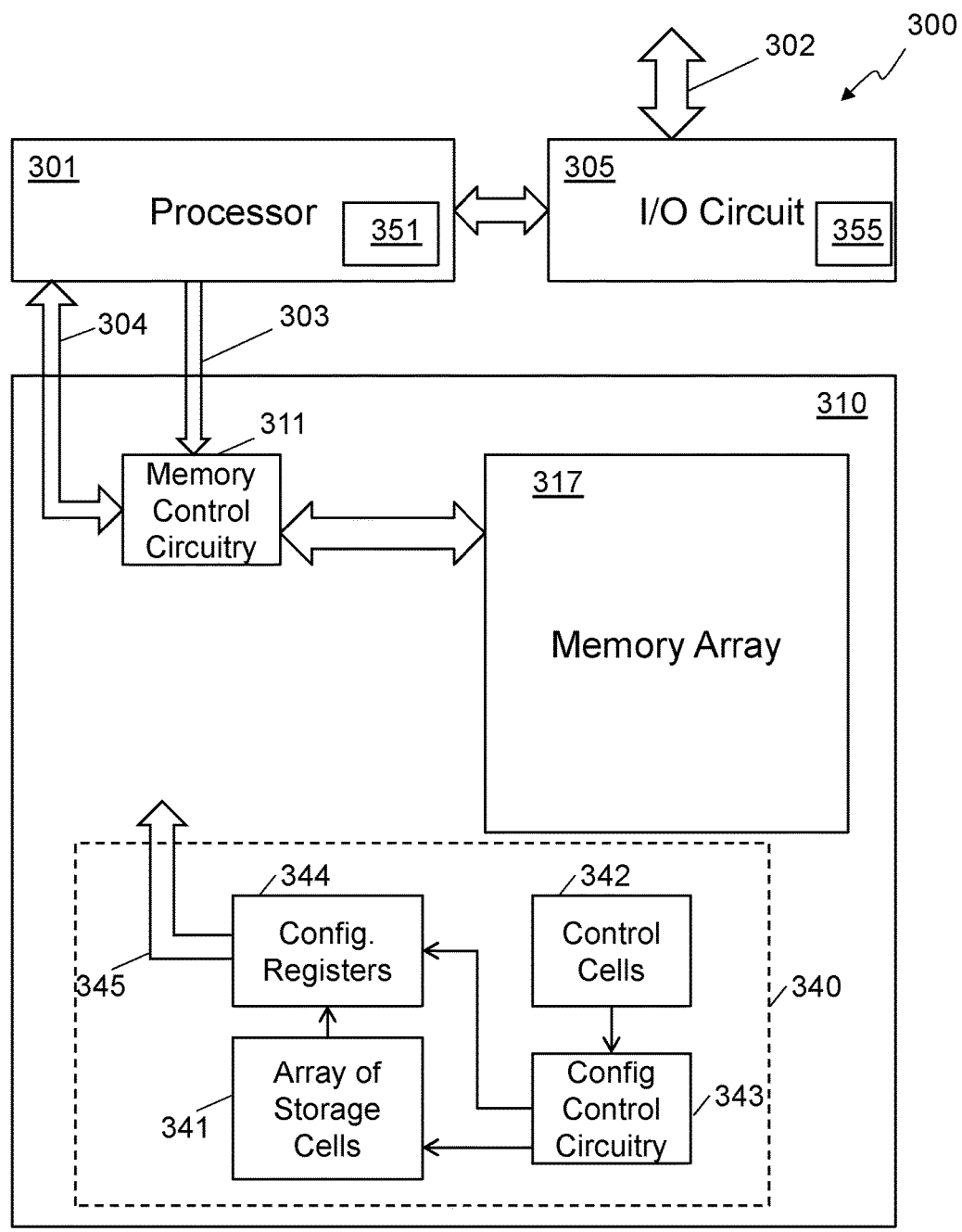
FIG. 3 is a block diagram of an electronic system using integrated circuits having alternate control settings.

FIG. 3 is a block diagram of an electronic system 300 using integrated circuits 301, 305, 310 having alternate control settings. The block diagram of computing or storage system 300 has been simplified to focus on features that are helpful in understanding this disclosure. A processor 301 is coupled to the memory device 310 with control/address lines 303 and data lines 304. In some embodiments, data and control may utilize the same lines. The processor 301 may be an external microprocessor, microcontroller, or some other type of external controlling circuitry. In some embodiments, the processor 301 may be integrated in the same package or even on the same die as the memory device 310 and/or I/O circuit 305. In some embodiments, the processor 301 may use the memory device 310 for program or data storage. The processor 301 may use additional external memory, such as random access memory (RAM) and read only memory (ROM) which is not shown, for program storage and intermediate data, and/or it may have internal RAM or ROM. A program running on the processor 301 may implement many different functions including, but not limited to, an operating system, a file system, bad cell or block mapping, and error management. In some embodiments the processor 301 may have alternate control settings 351 similar to that described in FIG. 1 and/or FIG. 2.

In some embodiments an external connection 302 is provided. The external connection 302 may be coupled to the I/O circuit 305 which may include alternate control settings 355 similar to those described in FIG. 1 and/or FIG. 2 above. The I/O circuit 305 may be coupled to the processor 301, or may be integrated into the processor 301 so that the processor 301 can communicate to external devices. If the electronic system 300 is a storage system, the external connection 302 may be used to provide an external device with non-volatile storage. The electronic system 300 may be a solid-state drive (SSD), a USB thumb drive, or any other type of storage system. The external connection 302 may be used to connect to a computer or other intelligent device such as a cell phone or digital camera using a standard or proprietary communication protocol. Examples of computer communication protocols that the external connection may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express.

If the electronic system 300 is a computing system, such as a mobile telephone, a tablet, a notebook computer, a set-top box, or some other type of computing system, the external connection 302 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)-Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

The memory device 310 may include an array 317 of memory cells. The memory array 317 may be arranged in banks of word line rows and bit line columns and may be controlled by the memory control circuitry 311 to allow the processor 301 to read and/or write data to the memory array 317. The memory device 310 may include alternate control settings 340 that may operate in a similar fashion to the IC 200 shown in FIG. 2. The memory device 310 may include an array of storage cells 341 that includes a first set of storage cells to store settings, and a second set of storage cells to store alternate settings. Configuration control circuitry 343 may access the array 341 based on a value of the control cells 342, and may write values, based on information accessed from the array 341, into configuration registers 344. The output 345 of the configuration registers 344 may control one or more operating parameters of the memory device 310, such as an access time of the memory array 317.

The system illustrated in FIG. 3 has been simplified to facilitate a basic understanding of the features of the memory. Many different embodiments are possible including using a single processor 301 to control a plurality of memory devices 310 to provide for more storage space. Additional functions, such as a video graphics controller driving a display, and other devices for human oriented I/O may be included in some embodiments.

Figure 4:
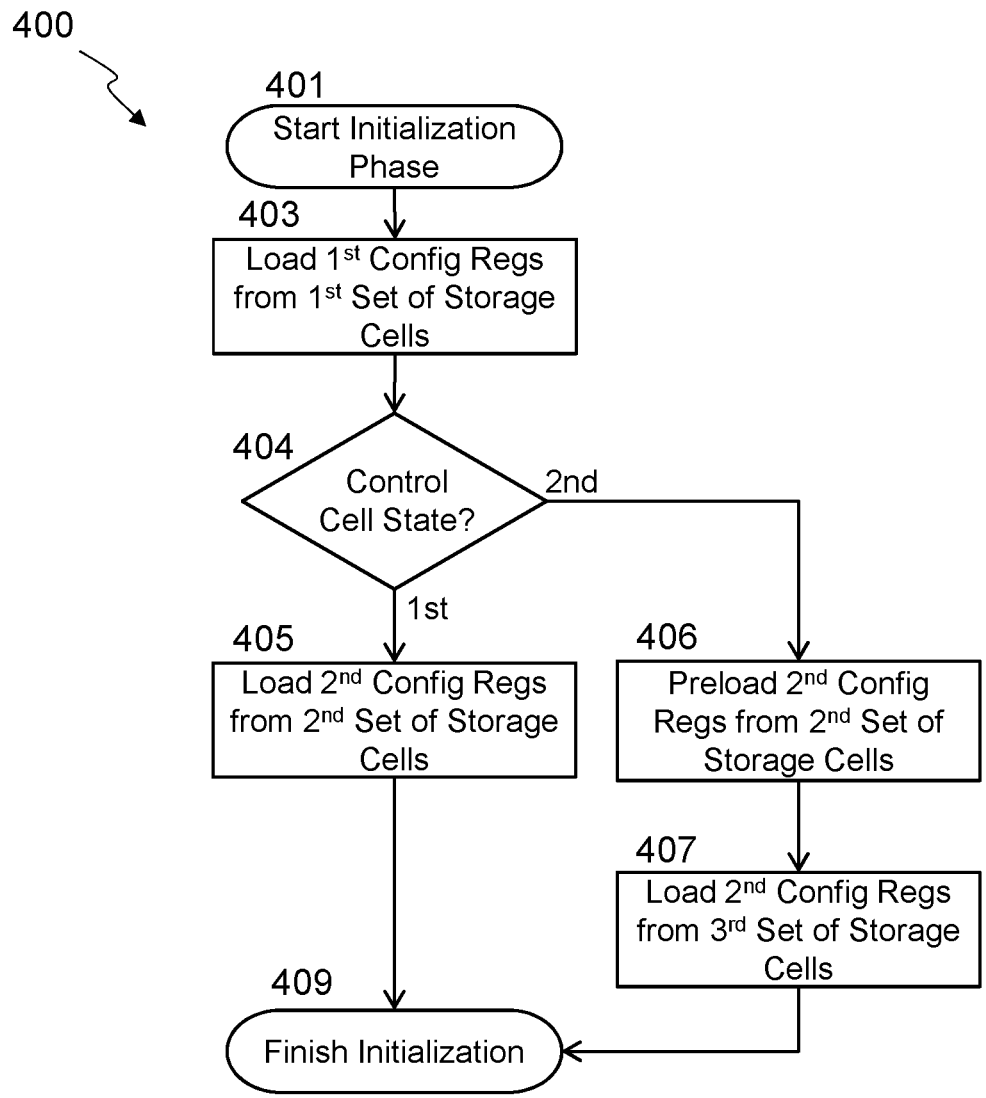
FIG. 4 is a flow chart of a method of initializing an integrated circuit using alternate control settings.

FIG. 4 is a flow chart 400 of a method of initializing an integrated circuit (IC) using alternate control settings. An initialization phase begins at block 401. The initialization phase may occur while a reset line is asserted to the IC, or in response to an application of power to the IC, under the control of a functional block of the IC, or for any other reason. A $1^{st}$ set of configuration registers may be loaded from a first set of storage cells at block 403 in some embodiments. The 1st set of configuration registers, in this embodiment, may not have alternate settings stored in another set of storage cells.

At block 404, a state of the at least one control cell is checked. If the at least one control cell is in a first state, the $2^{nd}$ set of configuration registers is loaded with data based on information stored in a $2^{nd}$ set of storage cells at block 405. In some embodiments, the data loaded into the $2^{nd}$ set of configuration registers comes directly from the $2^{nd}$ set of storage cells, although some embodiments may process the information from the $2^{nd}$ set of storage cells to create the data to load into the $2^{nd}$ set of configuration registers.

If the at least one control cell is in a second state, a $3^{rd}$ set of storage cells may contain information that should be used to load the $2^{nd}$ set of configuration registers. In some embodiments, block 406 may be skipped, and the $2^{nd}$ set of configuration registers may be loaded with data based on information stored in a $3^{rd}$ set of storage cells at block 407. In other embodiments, the $2^{nd}$ set of configuration registers may be preloaded with data based on information stored in a $2^{nd}$ set of storage cells at block 406, before some or all of the $2^{nd}$ set of configuration registers are loaded with data based on information stored in a $3^{rd}$ set of storage cells at block 407. Initialization may be finished at block 409.

Figure 5:
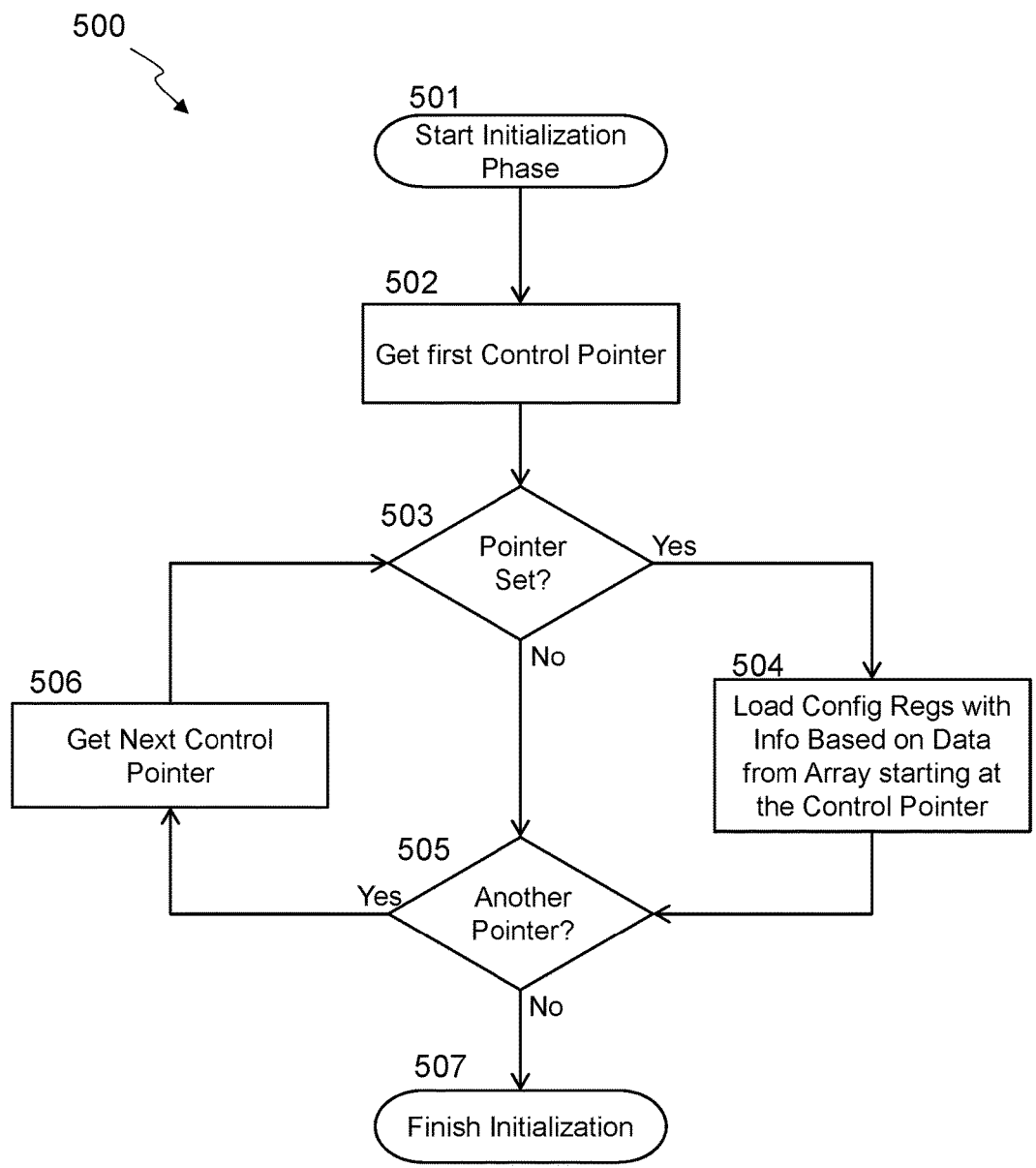
FIG. 5 is a flow chart of another method of initializing an integrated circuit using alternate control settings.

FIG. 5 is a flow chart 500 of another method of initializing an integrated circuit using alternate control settings. Initialization begins at block 501 and a first control pointer is retrieved at block 502. The first control pointer may be based on the state of the control bits in some embodiments but other embodiments may have a predetermined value to use as the first control pointer. At block 503 a check may be made to see if the control pointer is valid. In some embodiments, the pointer may be checked against predetermined limits to see if the pointer is valid. In other embodiments the data in an array of memory pointed to by the pointer may be checked to see if it is valid to validate the pointer. If the pointer is valid, the data in the array of memory pointed to by the pointer may be used to load configuration registers at block 504. The configuration registers loaded may be determined at design time and may be based on the pointer value itself, or may be determined by the design of the control circuitry used to perform the method, or by any other mechanism.

At block 505 a check is made to see if there is another pointer. The number of possible pointer may be predetermined, or the last pointer may be indicated by a particular value of pointer, by a flag associated with the pointer, by the control cells themselves, or by some other method. If there is another pointer, the next control pointer is retrieved or calculated at block 506 and then checked at block 503. In some embodiments, the next control pointer may be directly programmed into the control bits. In other embodiments, the control pointer may be calculated based on the value of the control bits, such as multiplying a constant times the bit number of the last set value in the control bits. Any method may be used to calculate the next control pointer. After the last pointer has been used to load configuration registers with data from the array the initialization is finished at block 507.

In some embodiments, the IC may function without any configuration registers loaded with data from storage cells. The IC may operate with configuration registers in a default state due to the design of the IC. One embodiment of such an IC may be illustrated with the flowchart 500 of FIG. 5. If the first control pointer that is retrieved in block 502 is found not to be set in block 503, and then it is found that there is no other pointer at block 505, initialization may complete at block 507 without loading any configuration registers with data from the array. If at a later time, data is programmed into the array of that IC, and the control bit programmed, any initialization occurring after that time would see that the pointer was set at block 503 and load the configuration registers with data from the array at block 504.

Figure 6:
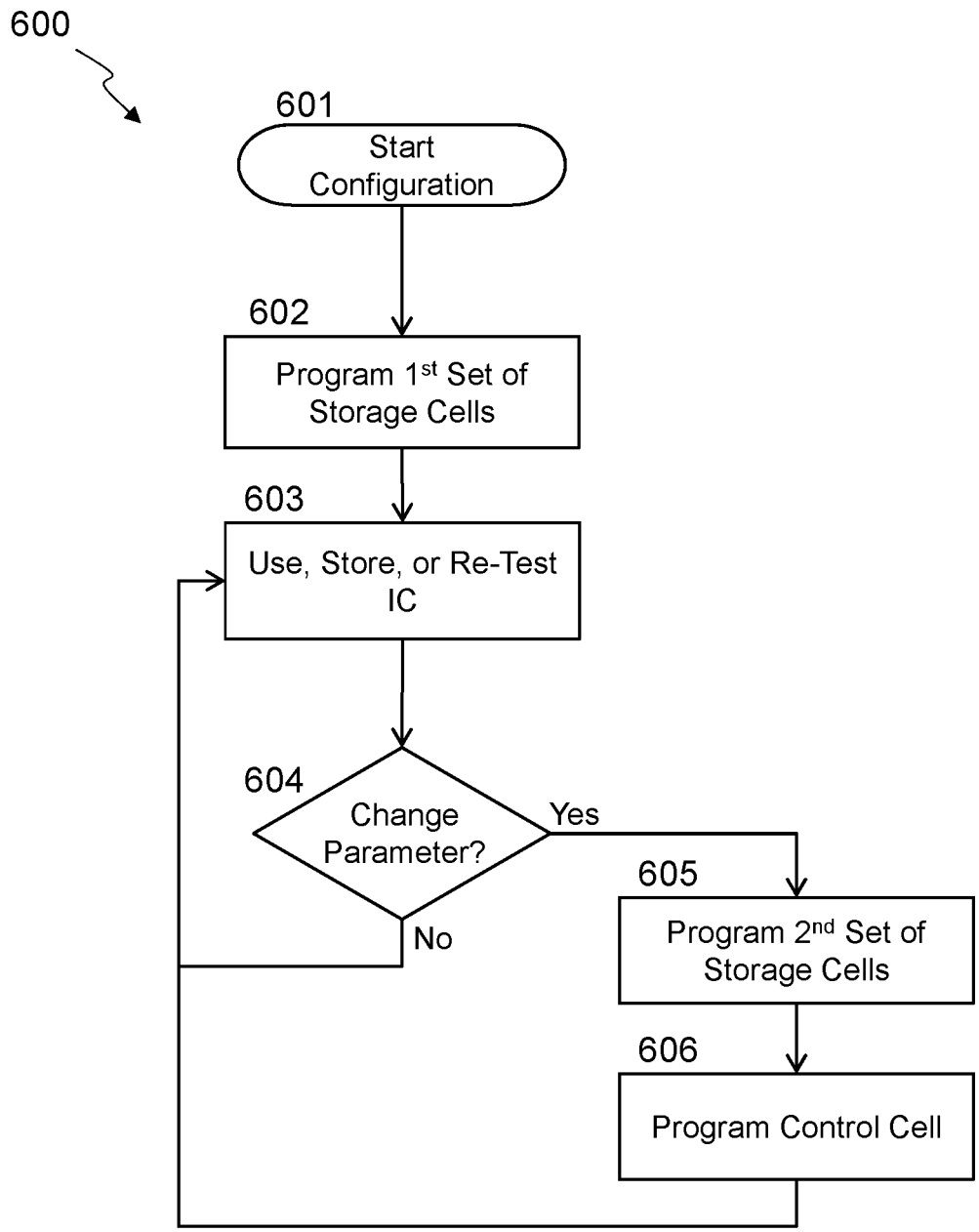
FIG. 6 is a flow chart of a method to reconfigure an integrated circuit with alternate control settings.

FIG. 6 is a flow chart 600 of a method to reconfigure an integrated circuit (IC) with alternate control settings. Configuration begins at block 601 and a first set of storage cells is programmed with information to control one or more operating parameters of the integrated circuit at block 602. Time may pass and at block 603 the IC may be used, stored, re-tested, or some other event may occur to make a determination at block 604 as to whether a parameter should be changed. If a parameter should be changed, a second set of storage cells is programmed with information to control one or more operating parameters of the integrated circuit at block 605. The information programmed into the second set of storage cells may be useful to change the parameter to a different value. At block 606 a control cell may be programmed to indicate that the second set of storage cells has been programmed and should be used to control the one or more operating parameters of the integrated circuit. The IC can then be used, stored, or re-tested at block 603. Depending on the embodiment, additional sets of storage cells and control cells may be programmed to further change the one or more parameters of the IC as necessary over time and as allowed for by the design. This could be represented as additional passes through blocks 604, 605 and 606, with different sets of storage cells and control cells being programmed.

The flowcharts and/or block diagrams in the figures help to illustrate the architecture, functionality, and operation of possible implementations of systems and methods of various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Examples of various embodiments are described in the following paragraphs:

An integrated circuit may include a first set of storage cells to store settings, a second set of storage cells to store alternate settings; and at least one control cell to indicate whether to use the settings stored in the first set of storage cells, or the alternate settings stored in the second set of storage cells, to control one or more operating parameters of the integrated circuit. In some integrated circuits at least one of, the first set of storage cells, the second set of storage cells, or the at least one control cell, may be non-volatile cells. In some integrated circuits at least one of, the first set of storage cells, the second set of storage cells, or the at least one control cell, may be one-time programmable cells. In some circuits at least one of, the first set of storage cells, the second set of storage cells, or the at least one control cell, comprise fuse links or anti-fuse links. Some integrated circuits may also include a third set of storage cells to store additional settings, and the additional settings may control additional operating parameters of the integrated circuit. Some integrated circuits may also include a multiplexer, controlled by an output of the at least one control cell, and having a first set of inputs coupled to outputs of the first set of storage cells, and a second set of inputs coupled to outputs of the second set of storage cells. The outputs of the multiplexer may control the one or more operating parameters of the integrated circuit. Some integrated circuits may also include an array of one-time programmable, non-volatile, memory cells, and the array may include the first set of storage cells and the second set of storage cells. Some integrated circuits may also include a control circuit to access the array based on a value of the at least one control cell and to write values, based on information accessed from the array, into one or more registers, to control the one or more operating parameters of the integrated circuit. Some integrated circuits may also include address lines coupled to the array to control which memory cells of the array are accessed and a state of the at least one control cell may determine a state of the address lines. Any combination of the examples of this paragraph may be used in embodiments.

A method to initialize an integrated circuit may include loading, during an initialization phase, a register with a first value based on information stored in a first set of storage cells if at least one control cell is in a first state, and loading, during the initialization phase, the register with a second value based on information stored in a second set of storage cells if the at least one control cell is in a second state. In some such methods the initialization phase occurs while a reset line is asserted to the integrated circuit. In some such methods the initialization phase occurs in response to an application of power to the integrated circuit. Some such methods may include loading, if the at least one control cell is in the second state, the register with the first value, before the loading of the register with the second value. Any combination of the examples of this paragraph may be used in embodiments.

A method to reconfigure an integrated circuit may include programming a first set of storage cells with information to control one or more operating parameters of the integrated circuit, determining, after the programming of the first set of storage cells, to change at least one of the one or more operating parameters of the integrated circuit to a different value, programming a second set of storage cells with information to change the at least one of the one or more operating parameters of the integrated circuit to the different value, and programming at least one control cell to indicate that the second set of storage cells is to be used to control the one or more operating parameters of the integrated circuit. In some such methods at least one of, the first set of storage cells, the second set of storage cells, or the at least one control cell, may be made with fuse links or anti-fuse links. In some such methods at least one of, the first set of storage cells, the second set of storage cells, or the at least one control cell, may be made with one-time programmable cells. Some such methods may also include programming a third set of storage cells with additional information to control additional operating parameters of the integrated circuit. Any combination of the examples of this paragraph may be used in embodiments.

An electronic system may include a processor to generate memory control commands, a memory, coupled to the processor, and an input/output circuit, coupled to the processor. At least one of, the processor, the memory, or the input/output circuit, may include a first set of storage cells to store settings, a second set of storage cells to store alternate settings, and at least one control cell to indicate whether to use the settings stored in the first set of storage cells, or the alternate settings stored in the second set of storage cells, to control one or more operating parameters the electronic system. In some electronic systems at least one of the first set of storage cells, the second set of storage cells, or the at least one control cell, may be made with non-volatile cells. In some electronic systems at least one of the first set of storage cells, the second set of storage cells, or the at least one control cell, may be made with one-time programmable cells. In some electronic systems at least one of, the first set of storage cells, the second set of storage cells, or the at least one control cell, may be made with fuse links or anti-fuse links. In some electronic systems at least one of, the processor, the memory, or the input/output circuit, may also include a third set of storage cells to store additional settings, and the additional settings control additional operating parameters of the electronic system. In some electronic systems at least one of, the processor, the memory, or the input/output circuit, may also include a multiplexer, controlled by an output of the at least one control cell, and having a first set of inputs coupled to outputs of the first set of storage cells, and a second set of inputs coupled to outputs of the second set of storage cells. The outputs of the multiplexer may control the one or more operating parameters of the electronic system. In some electronic systems at least one of, the processor, the memory, or the input/output circuit, may also include an array of one-time programmable, non-volatile, memory cells, and the array may include the first set of storage cells and the second set of storage cells. In some electronic systems at least one of, the processor, the memory, or the input/output circuit, may also include a control circuit to access the array based on a value of the at least one control cell and to write values, based on information accessed from the array, into one or more registers, to program the one or more operating parameters of the electronic system. In some electronic systems at least one of, the processor, the memory, or the input/output circuit, may also include address lines coupled to the array to control which memory cells of the array are accessed and a state of the at least one control cell may determine a state of the address lines. Any combination of the examples of this paragraph may be used in embodiments.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. An integrated circuit comprising:
   a first set of storage cells configured to store a first set of control settings;
   a second set of storage cells configured to store a second set of alternate control settings; and
   a non-volatile control cell coupled to the first set of storage cells and to the second set of storage cells, the non-volatile control cell having a state to indicate whether to use the first set of control settings or the second set of alternate control settings to control one or more operating parameters of the integrated circuit.

2. The integrated circuit of claim 1, wherein at least one of the first set of storage cells or the second set of storage cells comprise non-volatile storage cells.

3. The integrated circuit of claim 1, wherein at least one of the first set of storage cells or the second set of storage cells comprise one-time programmable cells.

4. The integrated circuit of claim 1, wherein at least one of the first set of storage cells or the second set of storage cells comprise fuse links or anti-fuse links.

5. The integrated circuit of claim 1, further comprising a third set of storage cells to store an additional set of control settings, wherein the additional set of control settings control additional operating parameters of the integrated circuit.

6. The integrated circuit of claim 1, further comprising:
   a multiplexer coupled to an output of the non-volatile control cell, the multiplexer including:
      a first set of inputs coupled to outputs of the first set of storage cells;
      a second set of inputs coupled to outputs of the second set of storage cells;
      wherein the state of the non-volatile control cell configures the multiplexer to use either the first set of inputs or the second set of inputs; and
      a multiplexer output configured to control the one or more operating parameters of the integrated circuit based on either the first set of inputs or the second set of inputs.

7. The integrated circuit of claim 1, further comprising:
   an array of non-volatile memory cells including the first set of storage cells and the second set of storage cells; and
   a control circuit coupled to the non-volatile control cell and configured to access the array based on the state of the non-volatile control cell, and to write values, based on information accessed from the array, into one or more registers, to control the one or more operating parameters of the integrated circuit.

8. The integrated circuit of claim 1, further comprising:
   an array of non-volatile memory cells including the first set of storage cells and the second set of storage cells; and
   address lines coupled to the array to control which memory cells of the array are accessed;
   wherein a state of the non-volatile control cell determines a state of the address lines.

9. A method to initialize an integrated circuit comprising:
   loading, during an initialization phase, a register with a first value based on information stored in a first set of storage cells if a non-volatile control cell is in a first state; and
   loading, during the initialization phase, the register with a second value based on information stored in a second set of storage cells if the non-volatile control cell is in a second state.

10. The method of claim 9, wherein the initialization phase occurs while a reset line is asserted to the integrated circuit.

11. The method of claim 9, wherein the initialization phase occurs in response to an application of power to the integrated circuit.

12. The method of claim 9, further comprising:
   loading, if the non-volatile control cell is in the second state, the register with the first value, before the loading of the register with the second value.

13. An electronic system comprising:
   a processor configured to generate memory control commands;
   a memory coupled to the processor; and
   an input/output circuit coupled to the processor;
   wherein at least one of the processor, the memory, or the input/output circuit comprise:
      a first set of storage cells configured to store a first set of control settings;
      a second set of storage cells configured to store a second set of alternate control settings; and
      a non-volatile control cell coupled to the first set of storage cells and to the second set of storage cells, the non-volatile control cell having a state to indicate whether to use the first set of control settings or the second set of alternate control settings to control one or more operating parameters the electronic system.

14. The electronic system of claim 13, wherein at least one of the first set of storage cells or the second set of storage cells comprise non-volatile cells.

15. The electronic system of claim 13, wherein at least one of the first set of storage cells or the second set of storage cells comprise one-time programmable cells.

16. The electronic system of claim 13, wherein at least one of the first set of storage cells or the second set of storage cells comprise fuse links or anti-fuse links.

17. The electronic system of claim 13, wherein at least one of the processor, the memory, or the input/output circuit further comprise:
   a third set of storage cells configured to store a third set of additional control settings;
   wherein the third set of additional control settings control additional operating parameters of the electronic system.

18. The electronic system of claim 13, wherein at least one of the processor, the memory, or the input/output circuit, further comprise:
   a multiplexer coupled to an output of the non-volatile control cell, the multiplexer further including:
      a first set of inputs coupled to outputs of the first set of storage cells;
      a second set of inputs coupled to outputs of the second set of storage cells;
      wherein the state of the non-volatile control cell configures the multiplexer to use either the first set of inputs or the second set of inputs; and
      a multiplexer output configured to control the one or more operating parameters of the electronic system based on either the first set of inputs or the second set of inputs.

19. The electronic system of claim 13, wherein at least one of the processor, the memory, or the input/output circuit further comprise:
   an array of non-volatile memory cells including the first set of storage cells and the second set of storage cells; and a control circuit coupled to the non-volatile control cell and configured to access the array based on the state of the non-volatile control cell, and to write values, based on information accessed from the array, into one or more registers, to program the one or more operating parameters of the electronic system.

20. The electronic system of claim 13, wherein at least one of the processor, the memory, or the input/output circuit further comprise:

an array of non-volatile memory cells including the first set of storage cells and the second set of storage cells; and address lines coupled to the array to control which memory cells of the array are accessed;

wherein a state of the non-volatile control cell determines a state of the address lines.

* * * * *